(12) United States Patent
Amou et al.

(10) Patent No.: US 6,930,140 B2
(45) Date of Patent: Aug. 16, 2005

(54) LOW DIELECTRIC LOSS TANGENT RESIN COMPOSITION, CURABLE FILM AND CURED PRODUCT, ELECTRICAL PART USING THE SAME AND METHOD FOR PRODUCTION THEREOF

(75) Inventors: Satoru Amou, Hitachi (JP); Shinji Yamada, Tsukuba (JP); Takao Ishikawa, Hitachi (JP); Takao Miwa, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 146 days.

(21) Appl. No.: 10/649,950

(22) Filed: Aug. 28, 2003

(65) Prior Publication Data

US 2004/0048965 A1 Mar. 11, 2004

Related U.S. Application Data

(62) Division of application No. 09/951,414, filed on Sep. 14, 2001, now Pat. No. 6,756,441.

(30) Foreign Application Priority Data

Feb. 27, 2001 (JP) ........................................ 2001-052321

(51) Int. Cl.$^7$ ................................................. C08L 9/00
(52) U.S. Cl. ........................ 524/475; 524/425; 524/430; 524/433
(58) Field of Search ................................ 524/575, 425, 524/430, 433

(56) References Cited

U.S. PATENT DOCUMENTS

| | | | | |
|---|---|---|---|---|
| 4,049,750 | A | * | 9/1977 | Brenner ........................ 525/25 |
| 4,874,826 | A | * | 10/1989 | Sakamoto et al. ........... 525/534 |
| 6,201,035 | B1 | * | 3/2001 | Tuinman et al. ............. 521/174 |
| 6,420,476 | B1 | * | 7/2002 | Yamada et al. .............. 524/575 |
| 6,448,301 | B1 | * | 9/2002 | Gaddam et al. ................ 522/6 |
| 6,500,535 | B1 | * | 12/2002 | Yamada et al. .............. 428/327 |
| 6,521,703 | B2 | * | 2/2003 | Zarnoch et al. ................ 525/17 |

FOREIGN PATENT DOCUMENTS

| | | |
|---|---|---|
| JP | 09-031006 | 4/1997 |
| JP | 11-060519 | 2/1999 |

OTHER PUBLICATIONS

Polymer Letters, Edition vol. 14, pp. 85–90 (1976).
Polymers for Advanced Technologies, vol. 5, pp. 245–252.
Polyfile P24–26, Nov. (1991).
Makromol. Chem. vol. 187, pp. 23–37 (1986).
J. Polym. Sci. Part A: Polym. Chem. vol. 32, pp. 2023–2027 (1994).

* cited by examiner

*Primary Examiner*—David W. Wu
*Assistant Examiner*—Henry S. Hu
(74) *Attorney, Agent, or Firm*—Dickstein Shapiro Morin & Oshinsky LLP (57) ABSTRACT

According to the present invention, there is provided a low dielectric loss tangent resin composition containing a crosslinking component having a weight average molecular weight of not more than 1,000 and a plurality of styrene groups and represented by the formula [1],

[1]

$$\left[ \begin{array}{c} \vphantom{\Big|} \\ \end{array} \right]_n \text{—R}$$

$(R^1)_m$ wherein R is a hydrocarbon skeleton which may have a substituent, $R^1$ is hydrogen, methyl or ethyl, m is an integer of 1–4 and n is an integer of 2 or more, and further containing at least one member selected from a high polymer having a weight average molecular weight of not less than 5,000 and a filler, which resin composition can give a cured product having a good flexibility, high tensile strength and low dielectric constant and dielectric loss tangent.

6 Claims, 1 Drawing Sheet

—♦— TENSILE STRENGTH Mpa
--■-- ELONGATION %

LOW DIELECTRIC LOSS TANGENT RESIN COMPOSITION, CURABLE FILM AND CURED PRODUCT, ELECTRICAL PART USING THE SAME AND METHOD FOR PRODUCTION THEREOF

This application is a divisional of U.S. patent application No. 09/951,414, filed Sep. 14, 2001, now U.S. Pat. No. 6,756,441 the entirety is incorporated herein by reference.

BACKGROUND OF THE INVENTION

The present invention relates to a low dielectric loss tangent resin composition used for insulating materials of electrical parts having low dielectric loss for corresponding to high frequency signals, cured products of the composition and electrical pats using the same.

In recent years, the signal band of information communication apparatuses, such as PHS and portable telephones, and the CPU clock time of computers have reached the GHz band, and the trend toward higher frequency is increasingly strong.

The dielectric loss of an electric signal is proportional to the square root of dielectric constant of the insulating material constituting the circuit and to the product of the dielectric loss tangent and the frequency of the signal used. Therefore, the higher the frequency of the signal, the larger the dielectric loss. Since dielectric loss causes attenuation of electric signals to lower the reliability of the signals, it has been necessary to select as an insulator a material which has a low dielectric constant and low dielectric loss tangent.

For obtaining an insulating material having a low dielectric constant and low dielectric loss tangent, it is effective to remove polar groups in its structure, and there have been proposed fluororesin, curable polyolefin, cyanate ester resin, curable polyphenylene oxide, allyl-modified polyphenylene ether and polyether imide modified with divinylbenzene or divinylnaphthalene.

Fluororesins typically represented by polytetrafluoroethylene (PTFE) have both a low dielectric constant and a low dielectric loss tangent and are used as materials for substrates which deal with high frequency signals. However, since PTFE is a thermoplastic resin, it undergoes large expansion and shrinkage in molding and processing and hence is a material not easy to handle.

A number of proposals have been made to impart crosslinkability or solubility to fluororesin. However, materials thus obtained are generally expensive, and many of them are not comparable to fluororesin in characteristic properties.

On the other hand, various studies have been made to obtain non-fluorine type resins of low dielectric constant and low dielectric loss tangent which are soluble in organic solvents and are easy to handle.

For example, there have been disclosed a product obtained by impregnating glass cloth with a diene-type polymer, such as polybutadiene, followed by curing with a peroxide (JP-A-8-208856), a cyclic polyolefin obtained by introducing an epoxy group into a norbornene-type addition polymer thereby to impart curability to the product (JP-A-10-158337) and-products obtained by heating cyanate ester, diene-type polymer and epoxy resin to reach the B-stage (JP-A-11-124,491).

There have been further disclosed many example, which include a modified resin comprising polyphenylene oxide, diene-type polymer and triallyl isocyanate (JP-A-9-118759), a resin composition comprising allyl-modified polyphenylene ether, triallyl isocyanate, etc. (JP-A-9-246429), an alloyed products of polyether imide with styrene and divinylbenzene and/or divinylnaphthalene (JP-A-5-156159), a product synthesized by the Williamson's reaction from a dihydroxy compound and chloromethylstyrene, e.g., a resin composition comprising hydroquinone bis(vinylbenzyl) ether and novolac phenol resin (JP-A5-78552)

Many of the examples mentioned above include in their disclosures a description that the cited product may contain divinylbenzene as a crosslinking agent or a crosslinking auxiliary. This can be attributed to the fact that divinylbenzene has no polar group in its structure and the cured product thereof has a low dielectric constant and low dielectric loss tangent and has a heat decomposition temperature of as high as 350° C. or more.

However, divinylbenzene has a defect in that since the cured product thereof is very brittle, cracks tend to develop in the cured product at the time of curing. Therefore, the amount of divinylbenzene added has been usually set at a low level as compared with other resin components.

Even in the example disclosed in JP-A-5-156159 wherein divinylbenzene is used as the main crosslinking agent, the amount added is about 9% by weight relative to the whole of the resin. Divinylnaphthalene also has a problem similar to that of divinylbenzene in point of brittleness of the cured product. Furthermore, since divinylbenzene is volatile, it vaporizes at the time of curing, making it difficult to control the characteristic property of the cured product.

As contrasted therewith, JP-A-5-78552 discloses that such bisstyrene compounds as hydroquinone bis (vinylbenzyl) ether are nonvolatile and can give a highly flexible cured product.

In general, however, an alkylene ether group is disadvantageous with respect to dielectric constant, dielectric loss tangent and heat resistance as compared with an alkylene group and arylene group.

A skeleton of hydrocarbon type, e.g., an alkylene group and arylene group, is preferable as the skeleton structure linking between styrene groups. Examples of a multifunctional styrene compound wherein styrene groups are linked by an ethylene group include 1,2-bisvinylphenylethane described in JP-A-9-208625 and a divinylbenzene oligomer having a vinyl group in the side chain described in Makromol. Chem. Vol. 187, pp 23 (1986). In these reports, however, no investigation was made regarding mechanical strength, heat resistance, dielectric constant and dielectric loss tangent.

Divinylbenzene, which has hitherto been used as a low dielectric constant and low dielectric loss tangent crosslinking agent, is disadvantageous in that it is volatile and its cured product is brittle.

SUMMARY OF THE INVENTION

The object of the present invention is to provide a low dielectric loss tangent resin composition containing a crosslinking agent which has a low dielectric constant and low dielectric loss tangent, is excellent in novolatility, solubility and compatibility with various resins and gives a good heat resistance and flexibility after curing, a curable film, a cured product thereof, an electrical part using the same as the insulating material and a method for producing the electrical part.

Some preferred embodiments of the present invention for attaining the above-mentioned object are described below.

(1) A low dielectric loss tangent resin composition containing a crosslinking component having a weight average molecular weight of not more than 1,000 and a plurality of styrene groups and represented by the formula [1]

[1]

wherein R is a hydrocarbon skeleton which may have a substituent, $R^1$ is hydrogen, methyl or ethyl, m is an integer of 1 to 4, and n is an integer of 2 or more, and further containing at least one member selected from a high polymer having a weight average molecular weight of not less than 5,000 and a filler;

the low dielectric loss tangent resin composition wherein the high polymer is one having film-forming ability;

the low dielectric loss tangent resin composition which contains a curing catalyst capable of polymerizing and crosslinking the styrene groups or a polymerization inhibitor which can suppress the polymerization and crosslinking of the styrene groups;

the low dielectric loss tangent resin composition wherein the high polymer contains at least one member selected from the group consisting of a homopolymer or copolymer of at least one monomer selected from butadiene, isoprene, styrene, ethylstyrene, divinylbenzene, N-vinylphenylmaleimide, acrylic ester and acrylonitrile, polyphenylene oxide which may have a substituent, polyolefin having a ring structure, polysiloxane and polyether imide;

the low dielectric loss tangent resin composition wherein the filler contains at least one member selected from the group consisting of calcium carbonate, magnesium hydroxide, titanium oxide, silicon oxide, borosilicate glass, aluminum borate and carbon, each having an average particle diameter of 0.1–100 $\mu$m;

the low dielectric loss tangent resin composition wherein the amount of the curing catalyst added is preferably 0.0005–10 parts by weight and the amount of the polymerization inhibitor added is preferably 0.0005–5 parts by weight, relative to 100 parts by weight of the whole resin component; and further the low dielectric loss tangent resin composition wherein the curing catalyst is an organic peroxide or a bisazide compound and the polymerization inhibitor is a quinone or an aromatic diol.

(2) A cured product obtained by curing the above-mentioned low dielectric loss tangent resin composition;

the cured product mentioned above wherein the dielectric loss tangent after curing is preferably not more than 0.002.

(3) A curable film which contains a crosslinking component having a weight average molecular weight of not more than 1,000 and a plurality of styrene groups and represented by the formula [1] and further contains a high polymer having a film-forming ability;

the curable film wherein a conductor layer has been formed on at least one surface of the curable film.

(4) An electrical part having an insulator layer wherein the insulator layer contains a cured product of a low dielectric loss tangent resin composition which contains a crosslinking component having a weight average molecular weight of not more than 1,000 and a plurality of styrene groups and represented by the formula [1] and further contains at least one member selected from a high polymer having a weight average molecular weight of not less than 5,000 and a filler.

(5) A method for producing an electrical part having an insulator layer wherein the insulator layer is a curable film containing a low dielectric loss tangent resin composition which contains a crosslinking component having a weight average molecular weight of not more than 1,000 and a plurality of styrene groups and represented by the formula [1] and further contains a high polymer having film-forming ability, and the curable film is lamination-bonded onto a conductor layer.

It was already described that the cured product of divinylbenzene has a high heat resistance, low dielectric constant and low dielectric loss tangent.

According to the present invention, a cured product which has a low dielectric constant and low dielectric loss tangent and develops no crack at the time of curing could be stably obtained by blending a crosslinking component having plural styrene groups linked with a hydrocarbon skeleton and having a weight average molecular weight of not more than 1,000 with a high polymer having a weight average molecular weight of not less than 5,000 or with a filler.

When a cyclic polyolefin was used as the high polymer component and 1,2-bis(vinylphenyl)ethane as the crosslinking component, the dielectric constant at 10 GHz was 2.19–2.25 and the dielectric loss tangent was 0.0011–0.0017. Since a cyclic polyolefin having no polar group was cured with a crosslinking component having similarly no polar group, a cured product having a low dielectric constant and low dielectric loss tangent was obtained.

Furthermore, since styrene groups are linked by such a flexible skeleton as alkylene group, no cracking occurs at the time of curing.

BRIEF DESCRIPTION OF THE DRAWINGS

In FIG. 2, numeral 1 indicates a spacer, 2 a resin composition and 3 copper foil.

DETAILED DESCRIPTION OF THE INVENTION

As described above, the low dielectric loss tangent resin composition and the cured product of the present invention contains a crosslinking component having a weight average molecular weight of not more than 1,000 and a plurality of styrene groups and represented by the formula [1] and further contains at least one member selected from a high polymer having a weight average molecular weight of not less than 5,000 and a filler. The weight average molecular weight in the present invention refers to a weight average molecular weight, calculated in terms of polystyrene, determined by GPC (gel permeation chromatography).

The insulating layer of electrical parts dealing with high frequency signals preferably has a low dielectric loss tangent from the viewpoint of decreasing the loss of electric signals. The desired value of the dielectric loss tangent in the frequency band of the electric signal used is not more than 0.005, preferably not more than 0.002. Using the present cured product as an insulating layer makes it possible to form an efficient electric circuit having a low dielectric loss.

The crosslinking component used in the present invention is preferably a multifunctional monomer having a weight average molecular weight of not more than 1,000 and a plurality of styrene groups. The styrene groups have a high reactivity and give a cured product or a polymer having a very low dielectric constant and dielectric loss tangent.

The dielectric constant and the dielectric loss tangent of polystyrene (mfd. by Wako Pure Chemical Industries, Ltd.), which has the simplest structure, are 2.36 and 0.0006, respectively (values obtained by the cavity resonance method at 10 GHz).

As the skeleton which links the styrene groups of the crosslinking component is preferably adopted a hydrocarbon skeleton containing an alkylene group, such as methylene and ethylene, from the viewpoint of obtaining a low dielectric constant and dielectric loss tangent. In this way, the crosslinking component can be imparted nonvolatility and flexibility without deterioration of the low dielectric constant and low dielectric loss tangent inherent to the styrene group.

By selecting a crosslinking component having a weight average molecular weight of not more than 1,000, a good melt flowability is obtained at relatively low temperatures and the solubility to organic solvents is improved and resultantly molding and varnish preparation are facilitated.

When the weight average molecular weight of the crosslinking component is too high, the melt flowability decreases and, in some cases, crosslinking occurs at the time of molding to result in defective molding. Preferred examples of the crosslinking component include 1,2-bis(p-vinylphenyl)ethane, 1,2-bis(m-vinylphenyl)ethane and their analogues, and such oligomers as homopolymers of divinylbenzene having a vinyl group in the side chain and copolymers thereof with styrene, etc.

The methods of synthesis of the crosslinking component preferred in the present invention include one which comprises coupling a halogenoalkylstyrene prepared by the method described in JP-A-11-60519 with various halides through a Grignard reaction and a method of synthesizing divinylbenzene oligomers having a vinyl group in the side chain described in Makromol. Chem. Vol. 187, p. 23 (1986).

Examples of the crosslinking components thus obtained and of synthesis starting materials are shown in Table 1. These crosslinking components may also be used in combination. Further, they may contain unreacted components and side products within ranges which do not cause marked deterioration in the dielectric constant, dielectric loss tangent and mechanical strength of the insulating layer.

TABLE 1

| Example of crosslinking component starting material | Example of crosslinking component |
|---|---|

TABLE 1-continued

| Example of crosslinking component starting material | Example of crosslinking component |
|---|---|

The crosslinking component of the present invention crosslinks at a relatively low temperature of not higher than 180° C. even without addition of a curing catalyst, to give a cured product having a high heat resistance and a low dielectric constant and dielectric loss tangent. The crosslinking component, however, when used alone, in some cases does not show a sufficient film-forming property and a sufficient tack freeness when formed into film, and does not give a sufficient mechanical strength after curing.

The present invention is characterized in that a high polymer having a weight average molecular weight of not less than 5,000 or a filler or both are further added to the above-mentioned crosslinking component with the intention of improving the film-forming property, film-forming ability and mechanical strength.

Further, it is possible to control the dielectric constant of the cured product or to obtain a product of lighter weight or low heat expansion by appropriate selection of the properties of the high polymer and the filler.

The high polymer used in the present invention is not particularly limited, but preferably has a weight average molecular weight of not less than 5,000, more preferably 10,000–100,000, most preferably 15,000–60,000.

When the molecular weight is too high, the varnish viscosity increases, making it difficult to stir and mix the low dielectric loss tangent resin composition and to form coating film. On the contrary, when the molecular weight is too low, in some cases the tack freeness of the coating film after drying deteriorates and/or the mechanical strength after curing does not improve.

When the low dielectric loss tangent resin composition is used in the form of a curable film, the high polymer used must have film-forming ability. Specific examples of such high polymers include homopolymers or copolymers of at least one monomer selected from the group consisting of butadiene, isoprene, styrene, ethylstyrene, divinylbenzene, N-vinylphenylmaleimide, acrylic ester and acrylonitrile; polyphenylene oxide which may have a substituent, polyolefin having a ring structure, polysiloxane and polyether imide.

Rubber-like polymers comprising butadiene, isoprene, acrylic ester or the like impart flexibility, adhesive property and the smoothness of coating film to the cured product; styrene, ethylstyrene and acrylonitrile, when copolymerized with the above-mentioned rubber-like components, serve to improve the heat resistance of the product.

Divinylbenzene and N-vinylphenylmaleimide are each a component for syntherizing a high polymer having a functional group in the side chain by copolymerization with a monofunctional monomer, such as styrene and ethylstyrene through a known method of ion polymerization. Since a high polymer having a functional group in the side chain reacts with the crosslinking component, it undergoes little phase separation after curing and gives a strong cured product.

Polyphenylene oxide, polyolefin having a ring structure, polysiloxane and polyether imide are heat resistant polymers having a high heat decomposition temperature and, when alloyed with the crosslinking component, serve for imparting flexibility and adhesive property and for improving mechanical strength.

These high polymers may be used in a combination thereof. For example, combined use of a cyclic polyolefin containing no polar group at all with polysiloxane or polybutadiene is effective in improving adhesion between the insulating layer and the conductor layer.

The filler used in the present invention is a component added for the purpose of improving the strength, lowering the heat expansion coefficient, controlling the dielectric constant, reducing the weight and roughening the surface to improve adhesion with the plated wiring.

For improving the strength, the addition of fibrous fillers, such as aluminum borate whiskers and carbon fiber is preferable. For lowering the heat expansion coefficient, it is preferable to fill to a high density a spherical filler, for example of silicon oxide, having different particle diameters. For controlling the dielectric constant, the addition of titanium oxide having a high dielectric constant or the addition of borosilicate glass baloons having a low dielectric constant is preferable. For surface-roughening, the addition of a filler soluble in aqueous alkali solution, such as calcium carbonate and magnesium hydroxide, is preferable. These fillers may be used each alone or in a combination thereof.

Though the particle diameter of the filler may vary depending on the thickness of the insulating layer ultimately formed, in a low dielectric loss tangent resin composition used for the insulating layer of a multilayer wiring board having a film thickness of from several $\mu$m to several hundred $\mu$m, particle diameters in the range of 0.1–100 $\mu$m are preferable. When the particle diameter is less than 0.1 $\mu$m, the surface roughening and the improvement of strength are insufficient in some cases, whereas when it exceeds 100 $\mu$m, the surface roughening of the insulating layer proceeds too much in some cases to lower insulation reliability. From above, the preferable particle diameter range is 0.1–60 $\mu$m.

The amounts of the crosslinking component, high polymer and filler to be added in the present resin composition are not particularly limited, but they are preferably in the range of 5–95 parts by weight for the crosslinking component, 95–5 parts by weight for the high polymer and 70–5 parts by weight for the filler, the total amount of the high polymer component and the crosslinking component being taken as 100 parts by weight.

The composition may be controlled, in the above-mentioned range of composition, according to the intended purposes of imparting film-forming property, improving the strength, lowering the heat expansion coefficient, controlling the dielectric constant, reducing the weight and roughening the surface to improve adhesion with the plated wiring. A more preferable composition range is 50–95 parts by weight of the crosslinking component, 50–5 parts by weight of the high polymer and 70–5 parts by weight of the filler, the total amount of the high polymer component and the crosslinking component being taken as 100 parts by weight. In this way, the solvent resistance of the low dielectric loss tangent resin composition after curing can be retained even when a high polymer having no crosslinkable functional group has been used.

Though the resin composition of the present invention can be cured by mere heating even without the addition of a curing catalyst, a curing agent capable of polymerizing styrene groups to effect crosslinking may be added for the purpose of improving the efficiency of curing. The amount of the catalyst to be added is not particularly limited but, since the residual group of the curing agent is liable to exert an adverse effect on the dielectric property, it is preferably 0.0005–10 parts by weight, the amount of the total resin component being taken as 100 parts by weight. When the composition is in the above-mentioned range, the polymerization and crosslinking of the styrene groups can be promoted, and a strong cured product can be obtained at low temperatures.

Some examples of a curing catalyst which generates, by the action of heat and/or light, a cationic or radical active species capable of polymerizing and crosslinking styrene groups are described below.

Examples of the cationic catalyst include diallyliodonium salts, triallylsulfonium salts and aliphatic sulfonium salts which act with $BF_4$, $PF_6$, $AsF_6$ or $SbF_6$ as a counter anion, and such commercially available catalysts as SP-70, 172 and CP66 mfd. by Asahi Denka Kogyo K.K., CI-2855 and 2823 mfd. by Nippon Soda Co., Ltd. and SI-100L and SI150L mfd. by SANSHIN KAGAKU KOGYO K.K.

Examples of the radical polymerization catalyst include benzoin type compounds such as benzoin and benzoinmethyl, acetophenone type compounds such as acetophenone and 2,2-dimethoxy-2-phenylacetophenone, thioxanthone type compounds such as thioxanthone and 2,4-diethylthioxanthone, bisazide compounds such as 4,4-diazidochalcone, 2,6-bis(4-azidobenzal)cyclohexanone and 4,4-diazidobenzophenone, azo compounds such as azobisisobutyronitrile, 2,2-azobispropane, m,m-azoxystyrene and hydrazone, and organic peroxides such as 2,5-dimethyl-2,5-di(t-butylperoxy)hexane, 2,5-dimethyl-2, 5-di(t-butylperoxy)hexyne-3 and dicumyl peroxide.

Particularly preferable is the addition of organic peroxides or bisazide compounds which can cause abstraction of the hydrogen of a compound having no functional group and can cause crosslinking between high polymers. In this way, the solvent resistance of the low dielectric loss tangent resin composition after curing can be improved.

The resin composition of the present invention may be incorporated with a polymerization inhibitor to increase the storage stability. The amount of the inhibitor to be added is preferably in a range not markedly deleterious to the dielectric property and to the reactivity in curing, and is desirably 0.0005–5 parts by weight relative to 100 parts by weight of the whole resin components. In the above-mentioned range, unnecessary crosslinking reactions during storage can be suppressed and a cured product can be obtained without causing a marked cure obstruction at the time of curing.

Examples of the polymerization inhibitor include quinones and aromatic diols, such as hydroquinone, p-benzoquinone, chloranil, trimethylquinone and 4-t-butylpyrocatechol.

The resin composition of the present invention, particularly that which contains a high polymer, can be used as a curable film obtained by coating the composition on a mold release film or a conductor foil, such as copper foil, or impregnating glass cloth, unoven fabric and the like with the composition, followed by drying.

It is also possible to form a curable film by blending the crosslinking component with a high polymer having film-forming ability. The present curable film can be worked up into a double-sided copper-clad film or substrate in a simple and easy way be pressing. Further, it can be used as the substrate of flexible printed boards and the interlayer adhesive for multilayer wiring board.

The resin composition of the present invention can also be used as a molding material. In particular, a resin composition comprising a crosslinking component and a filler has a low melting temperature and low-viscosity and hence can be easily poured even into a mold of a complicated shape at relatively low temperatures.

DESCRIPTION OF THE PREFERRED EMBODIMENTS

The present invention is described in detail below with reference to Examples and Comparative Examples. In the following description, "part" means "part by weight" unless otherwise specified.

First, description is given below of the name of the reagent, method of synthesis, method of preparation of varnish and method of evaluation of the cured product, used in Examples and Comparative Examples.

(1) Synthesis of 1,2-bis(vinylphenyl)ethane (BVPE)

The synthesis of BVPE was carried out by a known method. In a 500-ml three-necked flask was placed 5.36 g (220 mmol) of granular magnesium for Grignard reaction (mfd. by Kanto Chemical Co., Ltd.), and a dropping funnel, nitrogen inlet tube and septum cap were attached to the flask. Under a nitrogen stream, while the magnesium granules were being stirred with a stirrer, the whole system was dehydrated by heating with a drier.

Then, 300 ml of dry tetrahydrofuran was taken in a syringe and poured into the flask through the septum cap. The resulting solution was cooled to −5° C., and then 30.5 g (200 ml) of vinylbenzyl chloride (VBC) (mfd. by TOKYO KASEI K.K.) was added thereto by drops over about 4 hours by using the dropping funnel. After completion of the dropwise addition, stirring was continued at 0° C. for 20 hours. After completion of the reaction the reaction solution was filtered to remove residual magnesium, and the filtrate was concentrated with an evaporator.

The concentrated solution was diluted with hexane, washed once with a 3.6% aqueous hydrochloric acid solution and three times with pure water and then dehydrated with magnesium sulfate.

The dehydrated solution was purified by passing through a short column of silica gel (Wako gel C300, a trade name, mfd. by Wako Pure Chemical Industries, Ltd.)/hexane and dried under vacuum to obtain BVPE. The BVPE thus obtained was a mixture of m-compound (liquid) and p-compound (crystal) and the yield was 90%. Examination of the structure by $^1$H-NMR showed that the values thus observed were in agreement with those reported in the literature (J. Polym. Sci. Part A: Polym. Chem. Vol. 32, pp 2023 (1994))(6H-vinyl: α-2H, 6.7, β-4Gm 5,7 m 5,2; 8H-aromatic: 7.1–7.35; 4H-methylene: 2.9). This BVPE was used as the crosslinking component.

(2) Names of Other Reagents

Zeonex: Cyclic polyolefin (Zeonex 480, a trade name, mfd. by Nippon Zeon Co., Ltd.); high polymer (weight average molecular weight: about 60,000)

DVB: divinylbenzene (mfd. by Wako Pure Chemical Industries, Ltd.), crosslinking component of Comparative Example 3.

YS-10: aluminum borate whiskers (mfd. by SHIKOKU KASEI K.K.) (fiber diameter: 0.5–1 μm, fiber length: 10–30 μm); filler component of Example 6

25B: 2,5-dimethyl-2,5-bis(t-butylperoxy)hexyne-3 (Perhexyne 25B, a trade name, mfd. by Nippon Oil and Fats Co., Ltd.); curing catalyst toluene: mfd. by Wako Pure Chemical Industries, Ltd.; solvent for varnish preparation (3) Method of Preparation of Varnish Varnish was prepared by dissolving or dispersing respective specified amounts of a high polymer, crosslinking component, curing catalyst and filler in toluene.

The dispersion of the filler was carried but by stirring with a ball will. The resin composition for press-molding was prepared by drying the varnish thus prepared under vacuum.

(4) Method of Preparation of Resin Plate and Film for Evaluation

Resin plates of Examples 1–5 were each prepared by placing a specified amount of dried resin composition in a spacer made of polytetrafluoroethylene and applying heat and pressure thereto, through polyimide film and a mirror-finished plate, under vacuum. The heating was conducted by multi-stage heating of 120° C./30 min, 150° C./30 min, and 180° C./100 min at a pressing pressure of 1.5 MPa. The resin plate was formed in a size of 70 mm×70 mm×1 mm.

The resin films of Comparative Example 1 and Examples 1–5 were each prepared by coating a toluene resin varnish of 30 wt % concentration on PET film by using a bar coater, followed by drying under a nitrogen stream at 120° C. for 2 hours. The film was formed in a thickness of about 50 μm.

The resin plates of Comparative Examples 2–3 and Example 6 were each prepared by pouring a resin composition in a solvent-free state between two glass plates to which a polytetrafluoroethylene spacer had been sticked, followed by heating under tightly closed condition to effect curing. The heating was conducted by multi-stage heating of 120° C./30 min, 150° C./30 min and 180° C./100 min. The resin plate was formed in a size of 70 mm×70 mm×1 mm. Among the plates thus prepared, the resin plate formed of DVB alone developed cracks.

(5) Determination of Dielectric Constant and Dielectric Loss Tangent

The dielectric constant and dielectric loss tangent were determined by observing the values at 10 GHz by the hollow resonance method (using a Network Analyzer, Model 8722ES, a trade name, mfd. by Agilent Technologies and a hollow resonance apparatus, mfd. by KANTO DENSHI OHYO KAIHATSU).

(6) Determination of Tensile Strength and Elongation

The tensile strength and elongation were determined by using a tensile tester (Model AGS-100G, mfd. by Shimadzu Corp.) with a film sample of 50 μm thickness×4 mm width×70 mm length used for Comparative Example 1 and columnar samples of 1 mm thickness×1 mm width×70 mm length used for other Comparative Examples and Examples, at room temperature and at a distance between supporting points of 20 mm and a stretching rate of 10 mm/min.

(7) Glass Transition Temperature (Tg)

The Tg was determined by using a viscoelasticity measuring apparatus (DMA, Model DVA-200, mfd. by AITYI KEISOKU SEIGYO) from the peak position of tan δ. The shape of sample and distance between supporting points were the same as in the tensile strength determination. The temperature increasing rate was 5° C./min.

(8) Heat Decomposition Temperature

The heat decomposition temperature was determined by using a thermogravimetric analyzer (TGA, Model 2950, mfd. by Du Pont) and about 10 mg of sample under a nitrogen stream (10 ml/min) and at a temperature increasing rate of 5° C./min, the temperature at which 5 wt % of the original weight had decreased being taken as the heat decomposition temperature.

Table 2 shows the compositions of the resin compositions of the present invention of Examples 1–6 and the resin compositions of Comparative Examples 1–3 and the characteristic properties of these resin compositions.

TABLE 2

| | Comparative Example | | | Example | | | | | |
|---|---|---|---|---|---|---|---|---|---|
| | 1 | 2 | 3 | 1 | 2 | 3 | 4 | 5 | 6 |
| Composition | | | | | | | | | |
| Zeonex | 100 | 0 | 0 | 95 | 85 | 70 | 50 | 30 | 0 |
| BVPA | 0 | 100 | 0 | 5 | 15 | 30 | 50 | 70 | 100 |
| DVB | 0 | 0 | 100 | 0 | 0 | 0 | 0 | 0 | 0 |
| YS-10 | 0 | 0 | 0 | 0 | 0 | 0 | 0 | 0 | 30 |
| 25B | 0 | 1.00 | 1.00 | 0.05 | 0.15 | 0.30 | 0.50 | 0.70 | 1.00 |
| Varnish-resin property | | | | | | | | | |
| Varnish compatibility | — | — | ○ | ○ | ○ | ○ | ○ | ○ | — |
| Dielectric constant | 2.18 | 2.56 | — | 2.19 | 2.23 | 2.24 | 2.25 | 2.25 | 2.65 |
| Dielectric loss tangent | 0.0004 | 0.0017 | | 0.0011 | 0.0012 | 0.0014 | 0.0016 | 0.0017 | 0.0016 |
| Tensile strength (MPa) | 21.0 | 31.2 | — | 37.5 | 40.7 | 47.7 | 64.8 | 58.6 | 57.2 |
| Elongation (%) | 40.0 | 2.0 | — | 96.0 | 53.6 | 53.9 | 73.5 | 51.4 | 1.0 |
| Tg | 120 | ≧400 | — | 100 | 128 | 140 | 144 | 150 | ≧400 |
| Heat decomposition temperature (° C.) | 410 | 440 | 365 | 410 | 412 | 415 | 420 | 426 | 100 |
| Film-forming ability | ○ | X | X | ○ | ○ | ○ | ○ | ○ | X |

Note:
Film forming ability ○: satisfactory, X: unsatisfactory

COMPARATIVE EXAMPLE 1

Zeonex, a cyclic polyolefin soluble in organic solvents, was made up into a 30 wt % toluene solution, which was coated on PET film, dried under a nitrogen stream at 120° C. for 2 hours, and the PET film was peeled off to obtain a Zeonex film of about 50 μm thickness. It was found that the film had very low dielectric constant and dielectric loss tangent of 2.18 and 0.0004, respectively, and had a low mechanical strength, elongation and Tg.

COMPARATIVE EXAMPLE 2

It was found that the cured product comprising 1,2-bis(vinylphenyl)ethane of the crosslinking component alone had a low mechanical strength and elongation though it had a high heat decomposition temperature and Tg and a low dielectric constant and dielectric loss tangent.

COMPARATIVE EXAMPLE 3

Divinylbenzene, which have hitherto been used as the crosslinking component of low dielectric loss tangent resin materials, gives a high heat decomposition temperature. However, the dielectric constant, dielectric loss tangent and mechanical strength of the cured product thereof could not be determined because fine cracks had developed at the time of curing and at the time of cooling after curing.

EXAMPLES 1–5

Examples 1–5 relate to resin compositions wherein the compounding ratio of Zeonex, a high polymer, to BVPE, a crosslinking component, was varied.

The amount of 25B, a curing catalyst, added was set at 1 wt % of the BVPE content. As is apparent from respective Examples, the present resin compositions each had a very low dielectric constant and dielectric loss tangent, the dielectric constant being 2.19–2.25 and the dielectric loss tangent being 0.0011–0.0017.

Figure 1:
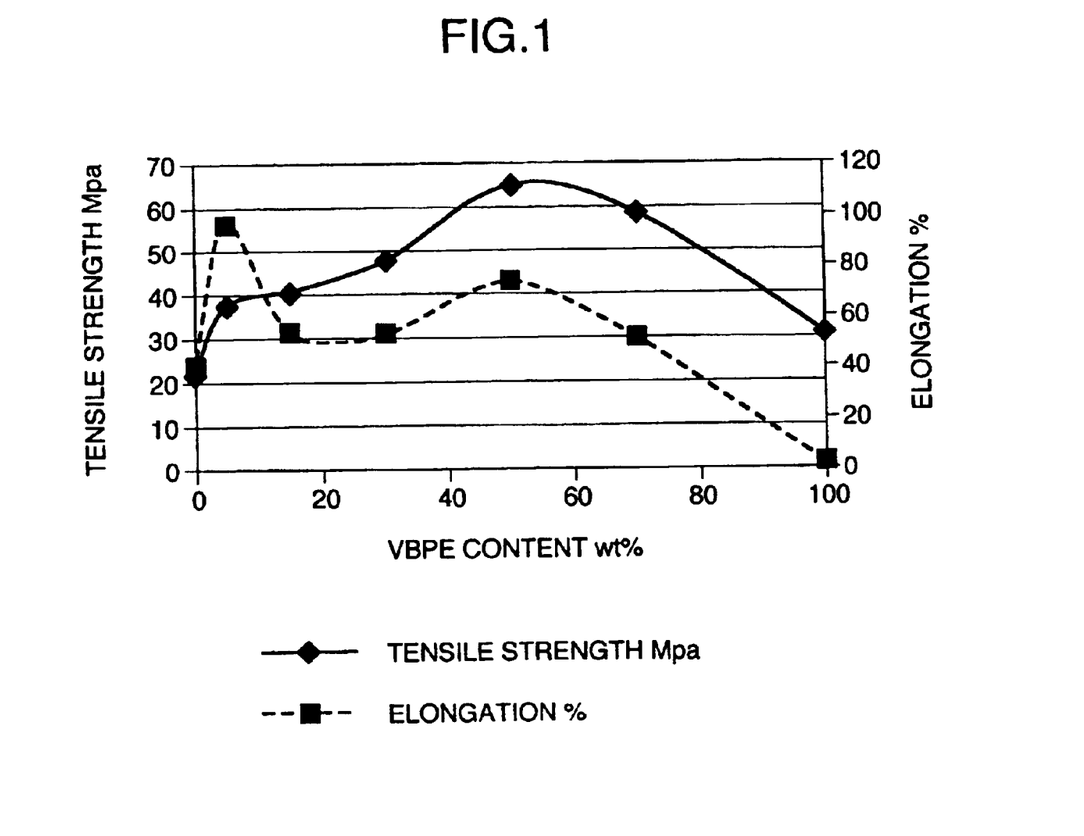
FIG. 1 is a graph showing the relation of the amount of a crosslinking component added with the tensile strength and elongation.

FIG. 1 shows the relation of the compounding ratio with the tensile strength and elongation for respective resin compositions. A high polymer alone (Comparative Example 1) showed a low tensile strength of 21 MPa and the cured product of a crosslinking component alone (Comparative Example 2) showed a low elongation of 2%, whereas, in Examples 1–5, both the tensile strength and the elongation were improved, the tensile strength being 37.5–64.8 MPa and the elongation being 51.4–94.0%.

The Tg tended to improve with the increase in the proportion of the crosslinking component and was in the range of 100–150° C. The heat decomposition temperature was not lower than 400° C. in all of the Examples, thus showing excellent heat resistance. Further, it has been confirmed that film formation is made possible by blending a high polymer and the crosslinking component.

EXAMPLE 6

Example 6 relates to a resin composition obtained by adding YS-10 (aluminum borate whiskers) as a filler to the crosslinking component.

Although the dielectric constant increased slightly due to the addition of the filler, the value of the dielectric loss tangent scarecely changed. The tensile strength was 57.2 MPa, being thus greatly improved by the addition of the filler as compared with Comparative Example 2 wherein no filler was added. The Tg was not lower than 400° C.

The present resin composition becomes a low viscosity liquid when heated to about 50° C. in the absence of solvent, so that it is suited to use for molding.

EXAMPLE 7

The resin compositions described in Examples 1–5 were each made up into a 30 wt % toluene resin varnish, which was coated on a PET film 50 μm in thickness by using a bar coater and then dried under a nitrogen stream at 120° C. for 2 hours to obtain a film. The thickness of the resin layer was about 50 μm.

Owing to the effect of the addition of a high polymer having a weight average molecular weight of not less than 5,000, the film after drying did not stick to each other even when stored in layers at room temperature, and could be easily peeled off from the PET film.

EXAMPLE 8

The resin composition of Example 4 was coated on the rough surface of an electrolytic copper foil of 18 μm thickness by using a bar coater and dried under a nitrogen stream at 90° C. for 1 hour to obtain a copper-clad film. The thickness of the resin layer was about 50 μm.

Figure 2:
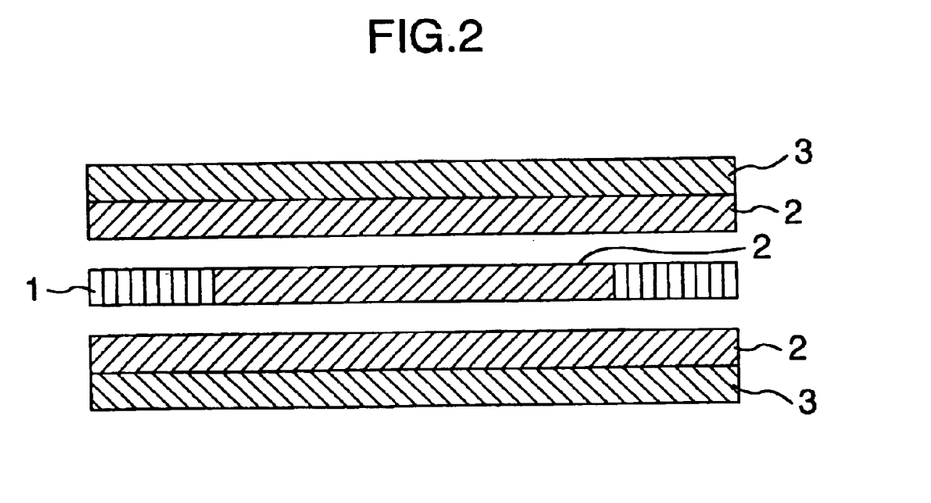
FIG. 2 is a schematic sectional view showing the positional relation of a spacer with a resin composition at the time of preparation of a double-sided copper-clad film.

Two sheets of the copper-clad film were prepared and, as shown in FIG. 2, with an aluminum spacer 1 of 100 μm thickness in which the resin film prepared in Example 7 from the resin composition of Example 4 had been placed interposed therebetween, pressure and heat were applied thereto by using a vacuum press to effect adhesion. The heating conditions were 120° C./30 min, 150° C./30 min and 180° C./100 min and the pressing pressure was 1.5 MPa.

Then, the aluminum spacer part was cut off to obtain a double-sided copper-clad film. The double-sided copper-clad film was a flexible film having a low dielectric constant and low dielectric loss tangent as well as a good flexibility.

EXAMPLE 9

A photoresist (HS 425, a trade name, mfd. by Hitachi Chemical Co., Ltd.) was laminated onto the double-sided copper-clad film obtained in Example 8, then exposed to light in a test pattern and developed with a 1% sodium carbonate solution. Thereafter, the copper foil of unexposed parts was removed by etching with an etching liquid containing 5% of sulfuric acid and 5% of hydrogen peroxide, to form a conductor wiring on the both surfaces.

The photoresist on the conductor wiring was removed with a 3% sodium hydroxide solution to obtain a film-formed wiring substrate. It was a flexible wiring substrate having a low dielectric constant and low dielectric loss tangent as well as a good flexibility.

EXAMPLE 10

A polytetrafluoroethylene cap was applied to one end of a hollow coaxial connector (a metal cylinder having wiring placed in its center) (SN 65264, a trade name, mfd. by Agilent Technologies) and tightly closed. Then the resin composition described in Example 6 was molten by heating to 50° C. and poured into the connector.

Thereafter the resulting system was subjected to a multistage heating of 120° C./30 min, 150° C./30 min and 180° C./100 min to obtain a heat resistant hollow connector. The resin part of the connector thus obtained showed neither sink nor cracks caused by cure shrinkage.

According to the present invention, by combining a specific crosslinking component having a plurality of styrene groups with various high polymers and/or fillers, cured products having a good flexibility, a high tensile strength and a low dielectric constant and dielectric loss tangent can be obtained.

The present resin composition is suited to use for insulating materials of high frequency electrical parts and can be applied to electrical parts for high frequency signals, such as adhesive film, wiring substrate materials and connectors.

What is claimed is:

1. A curable film which contains a crosslinking component having a weight average molecular weight of not more than 1,000 and a plurality of styrene groups and represented by the formula [1]

wherein R is a hydrocarbon skeleton which may have a substituent, $R^1$ is hydrogen, methyl or ethyl, m is an integer of 1–4 and n is an integer of 2 or more, and further contains a high polymer having film-forming ability.

2. The curable film according to claim 1 wherein a conductor layer has been formed on at least one surface of the curable film.

3. An electrical part having an insulator layer wherein the insulator layer contains a cured product of a low dielectric loss tangent resin composition which contains a crosslinking component having a weight average molecular weight of not more than 1,000 and a plurality of styrene groups and represented by the formula [1]

wherein R is a hydrocarbon skeleton which may have a substituent, $R^1$ is hydrogen, methyl or ethyl, m is an integer of 1–4 and n is an integer of 2 or more, and further contains at least one member selected from a high polymer having a weight average molecular weight of not less than 5,000 and a filler.

4. A method for producing an electrical part having an insulator layer wherein the insulator layer is a curable film containing a low dielectric loss tangent resin composition which contains a crosslinking component having a weight average molecular weight of not more than 1,000 and a plurality of styrene groups and represented by the formula [1]

wherein R is a hydrocarbon skeleton which may have a substituent, $R^1$ is hydrogen, methyl or ethyl, m is an integer of 1–4 and n is an integer of 2 or more, and further contains a high polymer having film-forming ability, and the curable film is lamination-bonded onto a conductor layer.

5. A cured product obtained by curing a low dielectric loss tangent resin composition, wherein said low dielectric loss tangent resin composition contains a crosslinking component having a weight average molecular weight of not more than 1,000 and a plurality of styrene groups and represented by the formula [1]

wherein R is a hydrocarbon skeleton which may have a substituent, $R^1$ is hydrogen, methyl or ethyl, m is an integer of 1–4 and n is an integer of 2 or more, and wherein said low dielectric loss tangent resin composition further contains at least one member selected from a high polymer having a weight average molecular weight of not less than 5,000 and a filler.

6. The cured product according to claim 5 wherein the dielectric loss tangent after curing is not more than 0.002.

* * * * *